United States Patent
Choi

(10) Patent No.: US 7,662,695 B2
(45) Date of Patent: Feb. 16, 2010

(54) CAPACITOR STRUCTURE AND FABRICATING METHOD THEREOF

(75) Inventor: Chee Hong Choi, Busan (KR)

(73) Assignee: Dongbu Electronics Co. Ltd., Seoul (KR)

( * ) Notice: Subject to any disclaimer, the term of this patent is extended or adjusted under 35 U.S.C. 154(b) by 8 days.

(21) Appl. No.: 12/149,795

(22) Filed: May 8, 2008

(65) Prior Publication Data

US 2008/0213958 A1    Sep. 4, 2008

Related U.S. Application Data

(62) Division of application No. 11/318,477, filed on Dec. 28, 2005, now Pat. No. 7,385,241.

(30) Foreign Application Priority Data

Dec. 29, 2004    (KR) .................. 10-2004-0114797

(51) Int. Cl.
    *H01L 21/20* (2006.01)
(52) U.S. Cl. .......... 438/396; 438/253; 257/307; 257/308
(58) Field of Classification Search .......... 438/253, 438/396; 257/307, 308
    See application file for complete search history.

(56) References Cited

U.S. PATENT DOCUMENTS

| 6,060,756 | A | 5/2000 | Machida et al. |
|---|---|---|---|
| 6,297,524 | B1 | 10/2001 | Vathulya et al. |
| 6,395,597 | B2 | 5/2002 | Noble |
| 6,528,837 | B2 | 3/2003 | Forbes et al. |
| 6,570,210 | B1 | 5/2003 | Sowlati et al. |
| 6,635,916 | B2 * | 10/2003 | Aton .................. 257/306 |
| 6,731,493 | B2 | 5/2004 | Zhong et al. |
| 6,743,671 | B2 | 6/2004 | Hu et al. |
| 6,765,778 | B1 | 7/2004 | Du et al. |
| 6,897,505 | B2 | 5/2005 | Aton |
| 6,909,591 | B2 | 6/2005 | Erickson et al. |
| 6,980,414 | B1 | 12/2005 | Sutardja |
| 7,009,241 | B2 | 3/2006 | Marotta |
| 7,013,436 | B1 | 3/2006 | Morton et al. |
| 7,034,396 | B2 | 4/2006 | Yajima |
| 7,091,537 | B2 | 8/2006 | Ozaki |
| 7,109,541 | B2 | 9/2006 | Jacquet et al. |
| 7,114,397 | B2 | 10/2006 | Fortin et al. |
| 7,166,902 | B1 | 1/2007 | Badriech et al. |
| 7,180,160 | B2 | 2/2007 | Ferrant et al. |
| 2002/0047154 | A1 | 4/2002 | Sowlati et al. |
| 2003/0161128 | A1 | 8/2003 | Masuda |
| 2004/0027785 | A1 | 2/2004 | Kim et al. |
| 2004/0246654 | A1 | 12/2004 | Williams et al. |

* cited by examiner

*Primary Examiner*—Zandra Smith
*Assistant Examiner*—Christy L Novacek
(74) *Attorney, Agent, or Firm*—Finnegan, Henderson, Farabow, Garrett & Dunner, L.L.P.

(57) ABSTRACT

Disclosed are a vertical-type capacitor and a formation method thereof. The capacitor includes a first electrode wall and a second electrode wall perpendicular to a semiconductor substrate, and at least one dielectric layer on the substrate to insulate the first electrode wall from the second electrode wall. The first electrode wall includes a plurality of first conductive layers and a plurality of first contacts, the plurality of first conductive layers being interconnected with each other by each of the plurality of first contacts. The second electrode wall includes a plurality of second conductive layers and a plurality of second contacts, the plurality of second conductive layers being interconnected with each other by each of the plurality of second contacts.

5 Claims, 2 Drawing Sheets

CAPACITOR STRUCTURE AND FABRICATING METHOD THEREOF

This application is a divisional of U.S. application Ser. No. 11/318,477, filed Dec. 28, 2005, now U.S. Pat. No. 7,385,241, which claims the benefit of priority of Korean Application No. 10-2004-0114797, filed on Dec. 29, 2004, both of which are incorporated by reference herein in their entirety.

BACKGROUND

1. Technical Field

The present invention generally relates to a semiconductor device manufacturing technology, and particularly to a capacitor structure formed in a semiconductor device, and a fabrication method thereof.

2. Description of the Related Art

A semiconductor device such as an integrated circuit (IC) generally has electronic circuit elements such as transistors, capacitors, and resistors fabricated integrally on a piece of semiconductor material. The various circuit elements are connected through conductive connectors to form a complete circuit that can contain millions of individual circuit elements. In particular, capacitors are used extensively in electronic devices for storing electric charge. Capacitors essentially comprise two conductive plates separated by an insulator such as a dielectric layer.

Advances in technologies of integrating semiconductor devices have resulted in a reduced overall size of IC elements. A variety of techniques have been explored to minimize the occupied surface area of a capacitor while maintaining sufficient capacitance. One technique employs an ultra-thin film of dielectric material as a capacitor dielectric layer, but it may incur device reliability problems. Another technique utilizes a new dielectric material having a higher dielectric constant, but it may require additional processes for adapting normal semiconductor device manufacturing processes for the new material.

Meanwhile, a metal-insulator-metal (MIM) capacitor, as shown in FIG. 1, is often used in integrated circuits. A MIM capacitor is a particular type of capacitor having two metal plates sandwiching a dielectric layer. The two metal plates and the dielectric layer are parallel to a semiconductor substrate.

To form a MIM capacitor, a bottom electrode 13 and a dielectric layer 14 are formed and patterned, in sequence, on an interlevel dielectric layer 12 that insulates an upper metal layer (now shown) and a lower metal layer 11 on a semiconductor substrate 10. A top electrode 15 is then formed by depositing a conductive material, and lithographically patterning and etching the conductive material. Thus, the MIM capacitor consists of the bottom electrode 13, the dielectric layer 14, and the top electrode 15.

Because the metal plates are parallel to the substrate, a conventional MIM capacitor can be several hundred micrometers wide, which is much larger than a transistor, a memory cell, or any other elements. Thus, conventional MIM capacitors are difficult to integrate in highly integrated semiconductor devices.

SUMMARY OF THE INVENTION

The present invention provides a vertical-type capacitor structure, which can be formed by a normal metallization process, and does not require separate capacitor formation processes. The vertical-type capacitor structure occupies a minimum surface area of a semiconductor substrate and thus enables higher integration.

A capacitor consistent with an embodiment of the present invention includes a first electrode wall and a second electrode wall perpendicular to a semiconductor substrate, and a at least one dielectric layer on the substrate to insulate the first electrode wall from the second electrode wall. The first electrode wall includes a plurality of first conductive layers and a plurality of first contacts, the plurality of first conductive layers being interconnected with each other by each of the first plurality of contacts. The second electrode wall includes a plurality of second conductive layers and a plurality of second contacts, the plurality of second conductive layers being interconnected with each other by each of the plurality of second contacts.

The present invention also provides a method for forming a vertical-type capacitor, including the steps of: (a) forming a dielectric layer; (b) forming at least two trenches in the dielectric layer, the at least two trenches being separated from each other; and (c) filling a conductive layer in the at least two trenches.

Consistent with the present invention, steps (a) to (c) may be repeated to form at least two electrode walls perpendicular to a main surface of the substrate, each electrode wall having multiple conductive layers stacked over each other. The corresponding conductive layers of the at least two electrode walls are separated from each other the corresponding dielectric layers. In addition, the conductive layers of each of the at least two electrode walls are interconnected by a plurality of contacts. The contacts are formed by forming a contact hole in each of the at least two trenches, and filling the conductive layer in the contact holes in the at least two trenches. The conductive layer may comprise Cu or other suitable metals.

These and other aspects of the present invention will become evident by reference to the following description of the invention, often referring to the accompanying drawings.

BRIEF DESCRIPTION OF DRAWINGS

The accompanying drawings, which are incorporated in and constitute a part of this specification, illustrate embodiments of the invention and, together with the description, serve to explain the features, advantages, and principles of the invention.

In the drawings.

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts.

Figure 1:
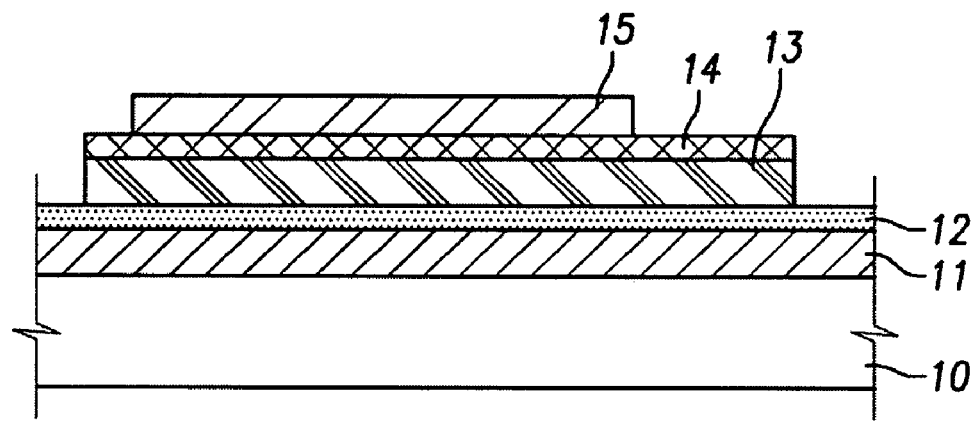
FIG. 1 is a cross-sectional view of a conventional metal-insulator-metal capacitor structure.
Figure 2:
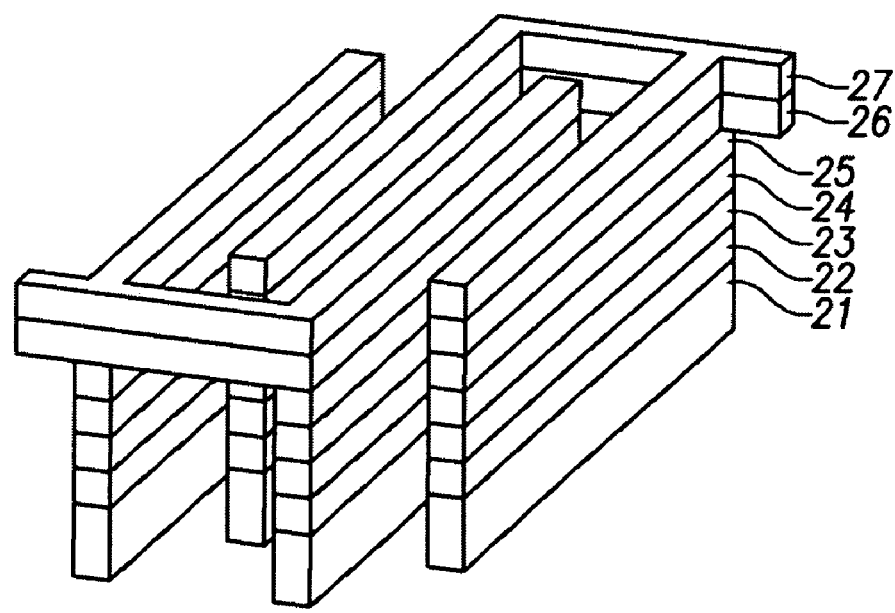
FIG. 2 is a perspective view of a vertical-type capacitor structure consistent with the present invention.
Figure 3:
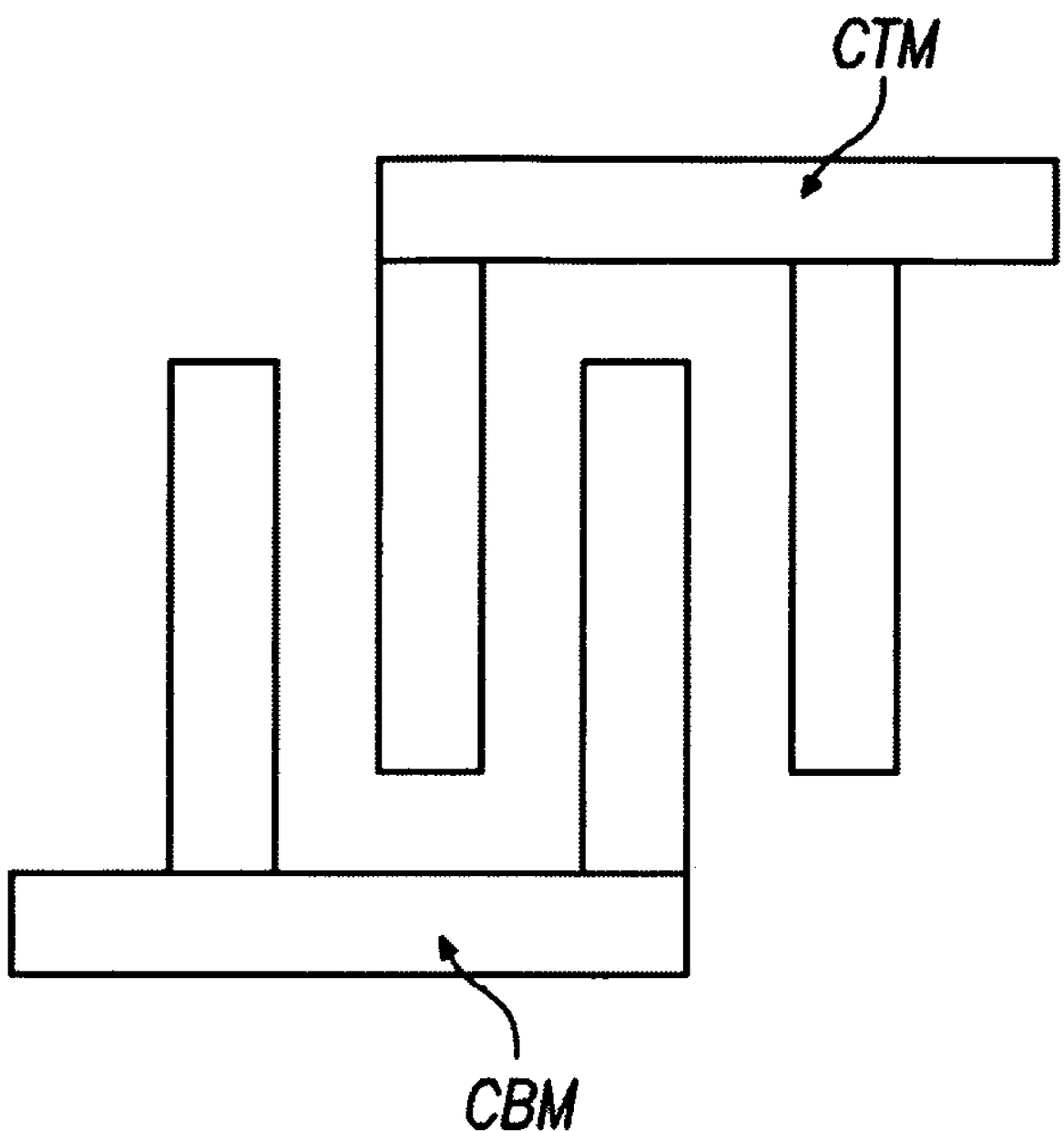
FIG. 3 is a top view of a vertical-type capacitor structure consistent with the present invention.

FIG. 2 is a perspective view of a vertical-type capacitor structure consistent with an embodiment of the present invention, and FIG. 3 is a top view of the vertical-type capacitor structure.

A first interlevel dielectric layer (not shown) is firstly formed on a semiconductor substrate (not shown). Then, a trench (not shown) is formed in the first interlevel dielectric layer by an etching process. A conductive material, such as copper (Cu), is formed on the first interlevel dielectric layer, filling the trench. Subsequently, the substrate is planarized to remove the conductive material by chemical-mechanical polishing (CMP), retaining a portion of the conductive material to form a first conductive layer 21, as shown in FIGS. 2 and 3.

The semiconductor substrate may include a variety of electronic circuit elements, as well as isolations such as shallow trench isolations that electrically isolate the electronic circuit elements from each other.

First conductive layer 21 may be formed in the isolation regions to minimize parasitic capacitances between the circuit elements.

Aluminum or aluminum alloys, which have low contact resistivity and relatively simple formation processes, are conventional conductive materials. However, as the integration density of semiconductor devices is increased, aluminum metallization may result in junction spiking and electromigration problems. Accordingly, alternative materials having a lower electric resistivity and adapted for a higher operational speed of the devices has been developed. For example, compared to aluminum and aluminum alloys, copper has a relatively low electric resistivity and no electromigration problems.

However, because copper rapidly diffuses into silicon or other metal layer and is a refractory material, copper metallization layer is typically formed by a damascene process, particularly a dual damascene process. A dual damascene process for forming copper connectors involves forming a trench and via hole in a dielectric layer, filling the trench and via hole with copper, and removing or planarizing a portion of copper over the dielectric layer to form a copper interconnections.

Therefore, first conductive layer 21 may comprise copper formed by a dual damascene process, which includes forming a trench and an underlying via hole, and simultaneously filling the trench and the via hole with a conductive material (e.g., copper) to form an interconnect line and an underlying via plug.

After the formation of first conductive layer 21, a second dielectric layer (not shown) is formed on the first dielectric layer and first conductive layer 21. Then, the second dielectric layer is etched to form a trench and a contact hole exposing first conductive layer 21. In particular, the trench and contact hole in the second dielectric layer preferably have the same dimension as first conductive layer 21.

Then, a barrier metal is deposited over the substrate, and another conductive material is then formed over the substrate, followed by a CMP process that planarized the substrate to retain a portion of the conductive material in the trench and contact hole in the second dielectric layer. Consequently, a first contact 22 and a second conductive layer 23 are formed and have the same dimension as first conductive layer 21.

After the formation of second conductive layer 23, a third dielectric layer (not shown) is formed over the substrate, and a trench and a contact hole is formed therein by an etching process. The trench and contact hole in the third dielectric layer expose second conductive layer 23 and have the same dimension as second conductive layer 23.

Subsequently, a barrier metal is formed over the substrate, and a conductive material is formed on the barrier metal layer. A CMP process is performed to remove a portion of the conductive material and the barrier metal, with a portion of the conductive material and the barrier metal remaining in the trench and the contact hole in the third dielectric layer to form a second contact 24 and a third conductive layer 25. Second contact 24 and third conductive layer 25 have the same dimension as first conductive layer 21, first contact 22, and second conductive layer 23.

A third contact 26 and a fourth conductive layer 27 are formed in the same manner as second contact 24 and third conductive layer 25. Namely, a fourth dielectric layer (not shown) is formed over the substrate, and a trench and contact hole are formed therein and have the same dimension as third conductive layer 25. Then, a barrier metal and a conductive material are formed and polished by a CMP process to form third contact 26 and fourth conductive layer 27. Third contact 26 and fourth conductive layer 27 have the same dimension as third conductive layer 25.

As shown in FIGS. 2 and 3, first conductive layer 21, first contact 22, second conductive layer 23, second contact 24, third conductive layer 25, third contact 26, and fourth conductive layer 27 are stacked over each other to form a pattern having separate portions isolated by the first through the fourth dielectric layers. Each portion may be in a comb shape having multiple branches. FIGS. 2 and 3 show a first electrode wall labeled as CTM and a second electrode wall labeled as CBM each comprising a portion of the pattern of first conductive layer 21, first contact 22, second conductive layer 23, second contact 24, third conductive layer 25, third contact 26, and fourth conductive layer 27 stacked over each other. The first and second electrode walls CTM and CBM are isolated from each other by the first through fourth dielectric layers. Thus, the first and second electrode walls CTM and CBM and the first to fourth dielectric layers form a vertical-type capacitor. Because the first and second electrode walls are perpendicular to the substrate, the surface area occupied by the vertical-type capacitor is minimized. In addition, the capacitance of the vertical-type capacitor can be controlled by adjusting the distance between the first and second electrode walls. FIGS. 2 and 3 show that each of the first and second electrode walls has two branches that are interdigitated with each other. However, the first and second electrode walls can respectively comprise more than two branches, thus forming a greater capacitance of capacitor in a relatively simple manner.

Conductive layers 21, 23, 25, and 27, and contacts 22, 24, and 26 can be formed simultaneously with other metal contacts or interconnections in a normal multi-level metallization process. Accordingly, the present invention does not require separate processes for forming the vertical-type capacitor.

While the first and second electrode walls consist of four conductive layers as shown in FIGS. 2 and 3, the number of conductive layers is not so limited. It should be understood that the first and second electrode walls could comprise more or less than four conductive layers, depending on the design rule of semiconductor devices. The effective areas of the vertical-type electrode walls CTM and CBM increase as the number of metallization layers increases, as a result of which the capacitance of the vertical-type capacitor also increases.

As shown in FIGS. 2 and 3, the first and second electrode walls CTM and CBM respectively have a comb-form engaged with each other and are separated by the dielectric layers.

FIGS. 2 and 3 show that the first and second electrode walls respectively have two branches that are interdigitated with each other. However, the first and second electrode walls can respectively comprise more than two branches, thus forming a greater capacitance of capacitor in a relatively simple manner.

In addition, while the conductive layers and contacts are formed by Cu dual damascene method, in the above-described embodiment, it should be understood that other materials, such as aluminum or tungsten, may be used as well.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method for forming a capacitor in a semiconductor device, comprising the steps of:
   (a) forming a dielectric layer;
   (b) forming at least two trenches and at least two contact holes in the dielectric layer, the at least two trenches being separated from each other;
   (c) simultaneously filling the at least two trenches and the at least two contact holes to form conductive layers and contacts; and
   (d) repeating steps (a) to (c) to form at least two electrode walls perpendicular to a main surface of a semiconductor substrate, each electrode wall having multiple conductive layers and multiple contacts stacked over each other, the corresponding conductive layers and the corresponding contacts of the at least two electrode walls being separated from each other by the corresponding dielectric layers.

2. The method of claim 1, wherein filling the at least two trenches comprises filling the at least two trenches with copper.

3. The method of claim 1, further comprising forming a barrier metal layer on the dielectric layer, before filling the at least two trenches.

4. The method of claim 1, wherein the multiple conductive layers are formed to be interconnected with each other by the multiple contacts in the electrode walls.

5. The method of claim 4, wherein the contacts are formed to have the same dimension as the interconnected conductive layers, in the electrode walls.

* * * * *